United States Patent
Rusu et al.

(10) Patent No.: US 12,181,724 B2
(45) Date of Patent: Dec. 31, 2024

(54) APPARATUS AND METHODS FOR OPTICAL INTERCONNECTS

(71) Applicant: Taiwan Semiconductor Manufacturing Co., Ltd., Hsin-Chu (TW)

(72) Inventors: Stefan Rusu, Sunnyvale, CA (US); Wei-Wei Song, Sunnyvale, CA (US); Mohammed Rabiul Islam, Austin, TX (US); Chih-Tsung Shih, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 299 days.

(21) Appl. No.: 17/334,338

(22) Filed: May 28, 2021

(65) Prior Publication Data

US 2022/0382005 A1 Dec. 1, 2022

(51) Int. Cl.
| | |
|---|---|
| *G02B 6/13* | (2006.01) |
| *G02B 6/42* | (2006.01) |
| *G02B 6/43* | (2006.01) |
| *H01L 33/60* | (2010.01) |
| *H01L 33/64* | (2010.01) |

(52) U.S. Cl.
CPC .............. *G02B 6/43* (2013.01); *G02B 6/13* (2013.01); *G02B 6/4204* (2013.01); *G02B 6/4214* (2013.01); *G02B 6/4219* (2013.01); *G02B 6/428* (2013.01); *H01L 33/60* (2013.01); *H01L 33/64* (2013.01); *G02B 6/4269* (2013.01)

(58) Field of Classification Search
CPC . G02B 6/43; G02B 6/13; G02B 6/428; G02B 6/4269; G02B 6/4214; G02B 6/4204; G02B 6/4219; H01L 33/60; H01L 33/64
USPC .................................. 385/14, 119, 129–132
See application file for complete search history.

(56) References Cited

U.S. PATENT DOCUMENTS

| | | | | |
|---|---|---|---|---|
| 10,976,508 | B2* | 4/2021 | Mathai | G02B 6/4269 |
| 2020/0057218 | A1* | 2/2020 | Islam | G02B 6/4269 |
| 2022/0365299 | A1* | 11/2022 | Islam | G02B 6/421 |

* cited by examiner

*Primary Examiner* — Ryan A Lepisto
(74) *Attorney, Agent, or Firm* — Duane Morris LLP (57) ABSTRACT

Disclosed are apparatus and methods for optical interconnections that include the integration of a photonics die (pDie) and an electronic die (eDie) with a socket layer, waveguides and fiber connectors to enable high bandwidth communications. In one embodiment, an exemplary optical interconnect device includes an electronic die coupled to a photonics die and integrated with a substrate, a socket, a board, a pair of micro-lenses and a mirror coupled to a waveguide, which can be embedded in the board. In another embodiment, the waveguide is embedded in a socket layer and coupled to a fiber connector. In these embodiments, the exemplary optical interface device can be coupled one more other optical interconnect devices via a waveguide array and/or a fiber array.

20 Claims, 9 Drawing Sheets

APPARATUS AND METHODS FOR OPTICAL INTERCONNECTS

BACKGROUND

Cloud computing, enterprise networks, and data center networks continue to drive increased bandwidth demand. For example, requirements for rack-to-rack wires within data centers has grown to 100 Gbps and beyond with an associated increase in requirements for data transmission lanes. Increased bandwidth demand motivates the application of optical interconnect techniques between systems and components, and over a variety of distances. Optical interconnections have become a significant tool to improve performance of photonics and electrical board-level systems. One significant application for board-level optical interconnects is the coupling between boards or chips within server systems.

Current practices for board-level optical interconnects can employ discrete electrical dies and discrete photonics dies assembled on a printed circuit board (PCB). In a server system, a board-level optical interconnect can employ discrete electronic dies and discrete photonics dies for each individual lane, and utilize discrete fiber cable for coupling to another system. With a switch ASIC supporting 32-64 lanes, for example, one solution can include the integration of the discrete electronic dies on the switch ASIC and a group of photonics dies into several multi-lane clusters. Alternatively, if the electronic dies are not integrated with the switch ASIC, then large Serializer/Deserializer (SERDES) blocks can be required to drive the data in the server system. Such solutions are inefficient in terms of area and power. Therefore, what is needed are more efficient methods to integrate the electronic die and the photonics die with a PCB to support integrated waveguide formation and waveguide/fiber connections.

The information disclosed in this Background section is intended only to provide context for various embodiments of the invention described below and, therefore, this Background section can include information that is not necessarily prior art information (i.e., information that is already known to a person of ordinary skill in the art). Thus, work of the presently named inventors, to the extent the work is described in this background section, as well as aspects of the description that cannot otherwise qualify as prior art at the time of filing, are neither expressly nor impliedly admitted as prior art against the present disclosure.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise. In addition, the present disclosure may repeat reference numerals and/or letters in the various examples. This repetition is for the purpose of simplicity and clarity and does not in itself dictate a relationship between the various embodiments and/or configurations discussed.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present. Further, spatially relative terms, such as "beneath," "below,"

"lower,", "bottom", "underneath" "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein disclose optical interconnect devices that integrate socket layer with a package and a motherboard to enable waveguide formation and fiber connectivity. Optical interconnect devices can include an electronic die (eDie), a photonics die (pDie) and a substrate. The methods described herein can facilitate integration of the pDie, the eDie and an optical interconnect assembly, which can be coupled to a server system, for example. The integration of the pDie with the eDie with an added socket layer can enable high bandwidth communications through optical interconnects such as silicon waveguides while reducing area and power, in accordance with some embodiments. These solutions can provide bandwidths supporting data transfers of greater than 100 Gb/sec, in accordance with some embodiments.

Exemplary optical interconnect devices described herein include micro-lenses, waveguides, and sockets. These elements are briefly discussed below.

Micro-lenses can be used to optically couple light within a semiconductor device. In some embodiments, micro-lens arrays can be fabricated at wafer-levels, which can make micro-lenses low cost and highly accurate. Micro-lenses can be fabricated with Si or SiO2 and coated with anti-reflection layers, for example. They can be fabricated on the Si substrate of a silicon-on-insulator (SOI) wafer or a bulk silicon (Si) wafer and coated with anti-reflective layers to reduce reflection loss, in accordance with some embodiments. Micro-lenses can be used to reduce the reflective loss when light is coupled from one chip to another chip. In some embodiments, a first lens is used to collimate light and a second lens is used to focus light.

Waveguides can be used to guide waves, such as light signals with minimal loss of energy by restricting the transmission of energy in one direction. In some embodiments, routing waveguides can be formed on a board/socket using various materials, such as Si, SiN, or a polymer, such as SU-8. Compared with optical routing with fibers, such waveguides can have the advantages of compactness, low cost and high density. Depending on the material, a waveguide's typical width can range from sub-micron to 10 microns.

Sockets can be used to couple electronic components or elements within an electronic system or device. In some embodiments, optical routing structures can be fabricated or added to the socket in a similar manner as they are fabricated or added to a board. Fabrication can be based on an embedded photonics chip or based on polymer routing structures fabricated when making the socket.

Figure 1:
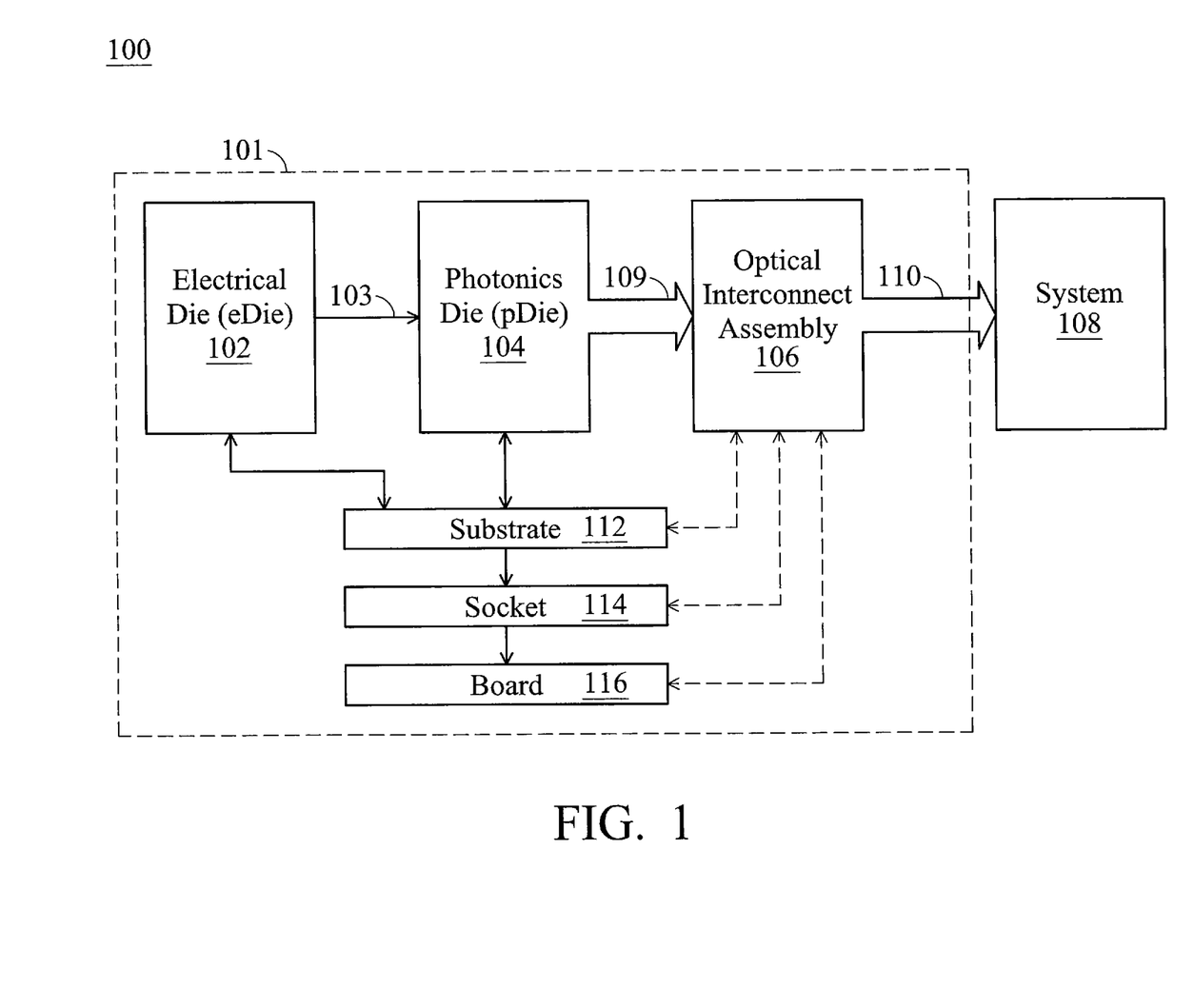
FIG. 1 illustrates a block diagram of an optical interconnect system in accordance with some embodiments.

FIG. 1 illustrates a block diagram of an exemplary optical interconnect system 100 that includes an optical interconnect device 101 coupled to an external system 108, in accordance with some embodiments of present disclosure. It is noted that the optical interconnect device 101 is merely an example, and is not intended to limit the present disclosure. Accordingly, it is understood that additional functional blocks can be provided in or coupled to the optical interconnect device 101 of FIG. 1.

In some embodiments, the external system 108 can be a computing device such as a server system. The optical interconnect device 101 can include an electronic die (eDie) 102, a photonics die (pDie) 104 and an optical interconnect assembly 106, which is coupled to a waveguide/fiber connection 110. In some embodiments, the eDie 102 can be referred to as a processor die. The eDie 102 can be electrically coupled to the pDie 104 via a signal line 103. In turn, the pDie 104 can generate a light signal 109 that is optically coupled to the optical interconnect assembly 106 that supports the waveguide/fiber connection 110. The waveguide/fiber connection 110 represents the output of the optical interconnect device 101 and can be coupled to the system 108. Suitable light sources for pDie 104 can include, for example, but without limitation, a laser diode or a light emitting diode (LED). The laser diode can be a laser-on-chip, where the lasing material is directly bonded and coupled to pDie 104. Another option for coupling a light source is the use of a fiber connector on board/socket to connect to an external light source (not shown).

In some embodiments, substrate 112 is coupled to the eDie 102 and the pDie 104 to support their semiconductor circuit functionality. The substrate 112 can also be coupled to the socket 114, which in turn can be coupled to the board 116. In various embodiments, the substrate 112, socket 114 and board 116 can provide the infrastructure to facilitate the optical transmission within the optical interconnect assembly 106, as discussed in further detail below.

Figure 2:
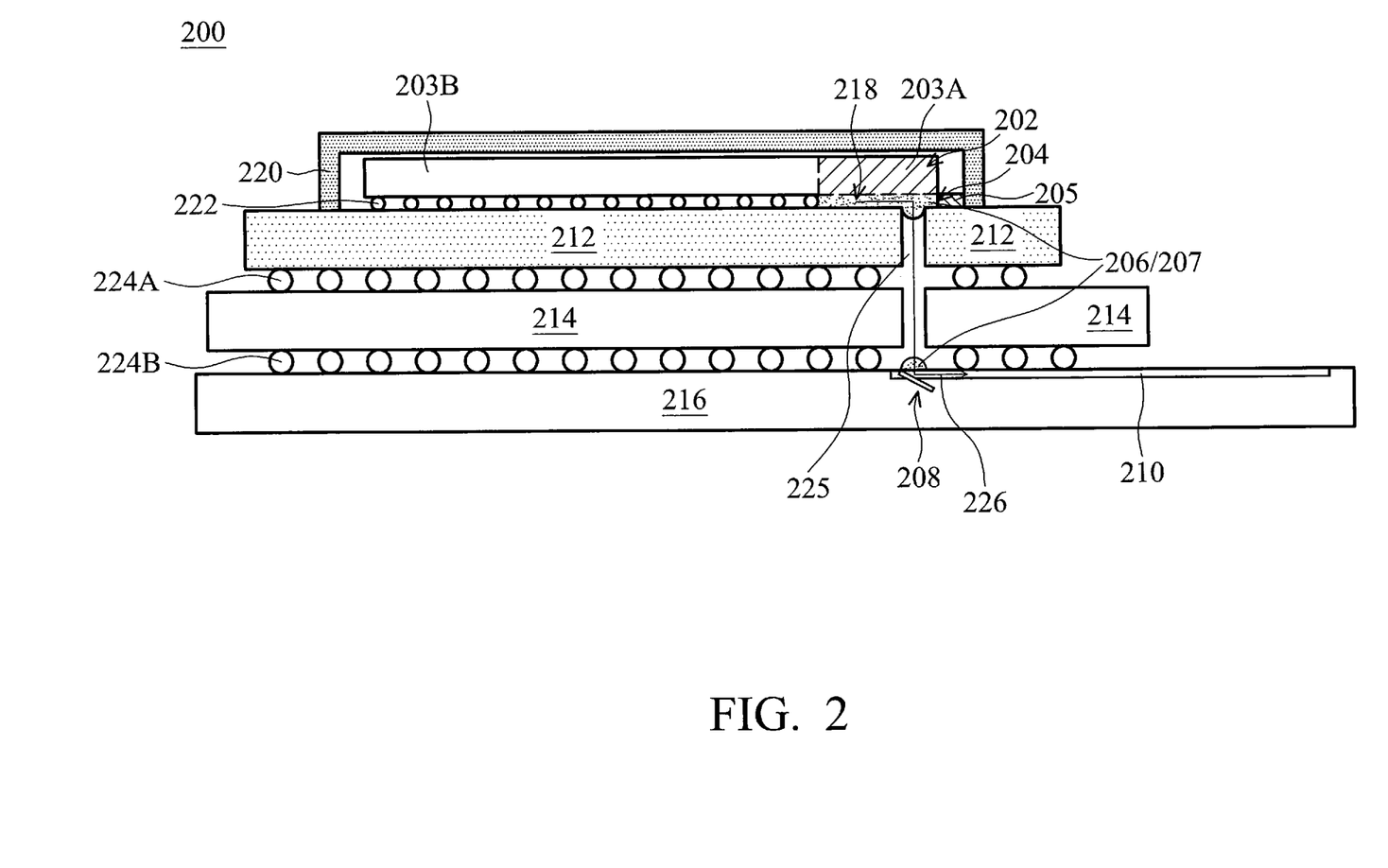
FIG. 2 illustrates a side view of an exemplary optical interconnect device including a photonics die (pDie) and an electronic die (eDie) integrated with a substrate, a socket, a board and a pair of micro-lenses that are coupled to a waveguide embedded in the board, in accordance with some embodiments of the present disclosure.

FIG. 2 illustrates a side view of an exemplary optical interconnect device 200 including the electronic Die (eDie) 202 and photonics die (pDie) 204 integrated with a substrate 212, a socket 214, a board 216, a pair of micro-lenses (first micro-lens 206 and second micro-lens 207), a mirror 208, a waveguide 210 and a heat spreader 220, in accordance with some embodiments of the present disclosure. In some embodiments, a first portion 203A of eDie 202 can be disposed on top of pDie 204, coupled via hybrid bonds 218. A second portion 203B of the eDie 202 can be disposed on top of the substrate 212 and coupled via a flip-chip interconnection method (C4 bump 222). The hybrid bonds 218 can be micro-bumps (μbumps) or hybrid bumps, in accordance with some embodiments. The pDie 204 can be disposed between the first portion 203A of eDie 202 and the substrate 212. The eDie 202 can comprise an ASIC switch, for example.

In some embodiments, the pDie 204 can be a silicon-on-insulator (SOI) chip that is hybrid integrated face-to-face with the integrated switch of the eDie 202 in a diving-board configuration, in which a portion 205 of the pDie 204 extends beyond an edge of the eDie 202. In this position, the pDie 204 is still disposed above the substrate 212. The diving-board configuration can provide easy access and physical space for attachments to one or more other components. For example, optical couplers (e.g., lenses) for optical fibers and light sources can be attached to the exposed surface of the pDie 204, in accordance with some embodiments.

In some embodiments, the socket 214 can be disposed beneath the substrate 212 and coupled to the substrate 212 via package bumps 224A. Similarly, the board 216 can be disposed beneath the socket 214 and coupled to the socket 214 via the package bumps 224B. In some embodiments, the substrate 212 is an interposer and the socket 214 is considered a second substrate and the board 216 is considered a third substrate. The heat spreader 220 can be positioned above the eDie 202 and attached to the substrate 212. As shown in FIG. 2, the heat spreader 220 transfers energy, i.e., heat, from a hotter source, eDIE 202, to a colder heat sink, e.g., substrate 212.

In some embodiments, eDie 202 sends an electrical signal to the pDie 204, causing the pDie 204 to transmit a light signal 226 to the first micro-lens 206. As illustrated, the first micro-lens 206 can be formed beneath the pDie 204 and on top of the substrate 612 and the second micro-lens 207 and can be formed on top of the board 216. The first micro-lens 206 and second micro-lens 207 are optically coupled via the holes formed in the substrate 212 and the socket 214, which form a light path 225 through which a light signal 226 can propagate. In various embodiments, the holes can be formed by etching or drilling. The holes are aligned to provide the light path 225 through the substrate 212 and socket 214, which allows a direct line of sight between the first micro-lens 206 and the second micro-lens 207. Thus, the first micro-lens 206 is optically coupled to the second micro-lens 207 to allow transmission of the light signal 226 there between.

In some embodiments, the first micro-lens 206 and second micro-lens 207 can be fabricated with silicon on insulator (SOI), silicon or a polymer, in accordance with various embodiments. In some embodiments, the first micro-lens 206 and second micro-lens 207 are lens arrays that function similar to the package bumps 224A. In some embodiments, a diameter of the first micro-lens 206 and second micro-lens 207 can be in the range of 80 to 150 μm (e.g., 100 μm). The holes extending through the substrate 212 and through the socket 214 can be filled with air or organic materials that are transparent for a selected wavelength of the light signal 226 generated by the pDie 204, in accordance with various embodiments.

In some embodiments, the mirror 208 can be positioned on the top of board 216 by first forming a hole in the board 216, then placing and gluing the mirror 208 to the board 216. The mirror 208 can be positioned at a 45 degree angle relative to the direction of the light signal 226 received from the second micro-lens 207. The light signal 226 is then reflected by the mirror 208 and coupled to the waveguide 210. As illustrated, the waveguide 210 can be formed or embedded within the board 216 and suitability positioned to be optically coupled with the mirror 208. In some other embodiments, the mirror 208 can be positioned at an angle other than a 45 degrees angle relative to the light signal 226 based on an alternative structure of the board 216. In some embodiments, mirror 208 is fabricated with metal-coated silicon. In some embodiments, waveguide 210 can be coupled to a fiber connector.

Figure 3:
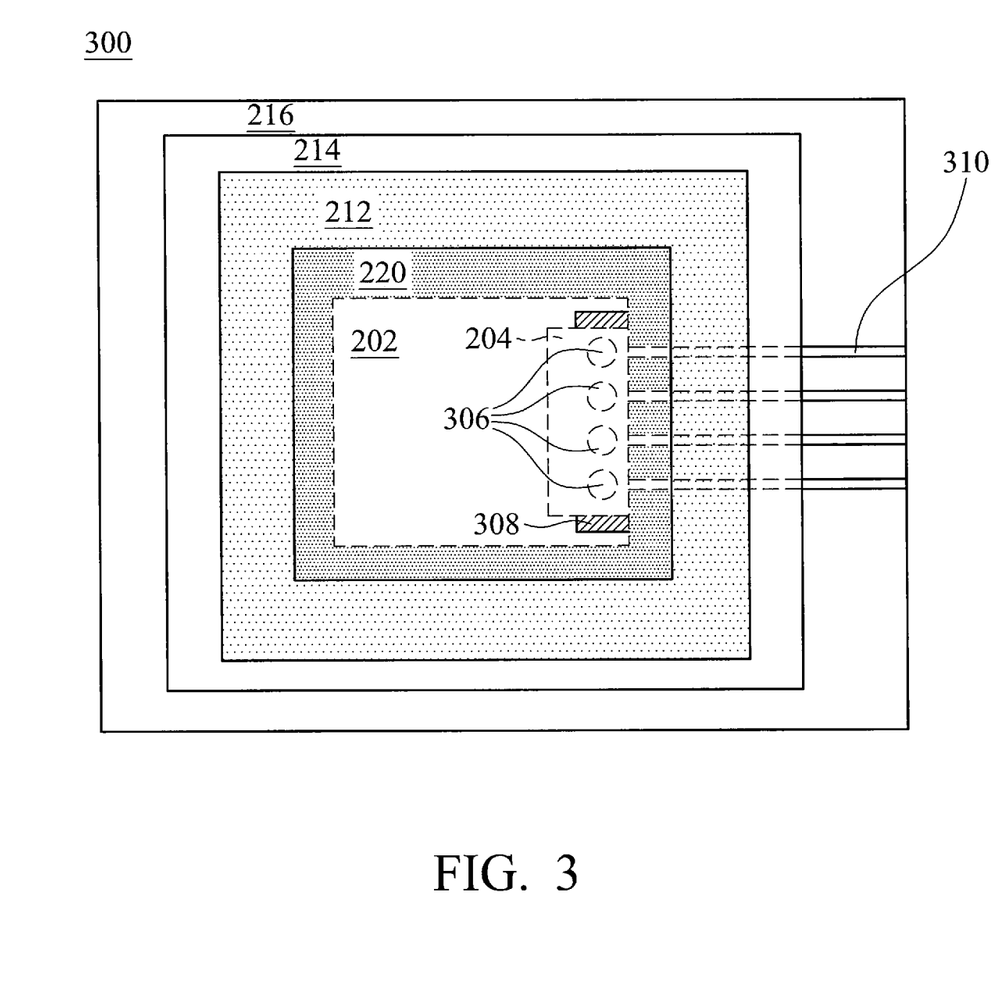
FIG. 3 illustrates a top view of an exemplary optical interconnect device per FIG. 2, in accordance with some embodiments of the present disclosure.

FIG. 3 illustrates a top view of an exemplary optical interconnect device 300 corresponding to the exemplary optical interconnect device 200 of FIG. 2, in accordance with some embodiments of the present disclosure. As illustrated, the board 216 is disposed underneath the socket 214, which in turn is disposed underneath the substrate 212, which in turn is disposed underneath the heat spreader 220. Disposed between the board 216 and the heat spreader 220 are the following: the eDie 202, the pDie 204 and a mirror structure 308. The mirror structure 308 includes at least one of a plurality of a micro-lenses 306. As shown in FIG. 3, the larger dotted line box indicates the positioning of the eDie 202 disposed beneath the heat spreader 220. The smaller dotted line box indicates positioning of the pDie 204 and the plurality of micro-lenses 306 disposed beneath the eDie 202. As illustrated, since the mirror structure 308 is disposed on top of the board 216, the mirror structure 308 can be referred to as an on-board mirror. Projecting out from the board 216 is a waveguide array 310. The number of lenses in the plurality of micro-lenses 306 can correspond to the number of waveguides in the waveguide array 310. As illustrated in FIG. 3, the number of lenses in the plurality of micro-lenses 306 and the number of waveguides 310 is four, in accordance with some embodiments. In some other embodiments, this number can be different. In some embodiments, the heat spreader 220 is attached to the substrate 212.

Figure 4:
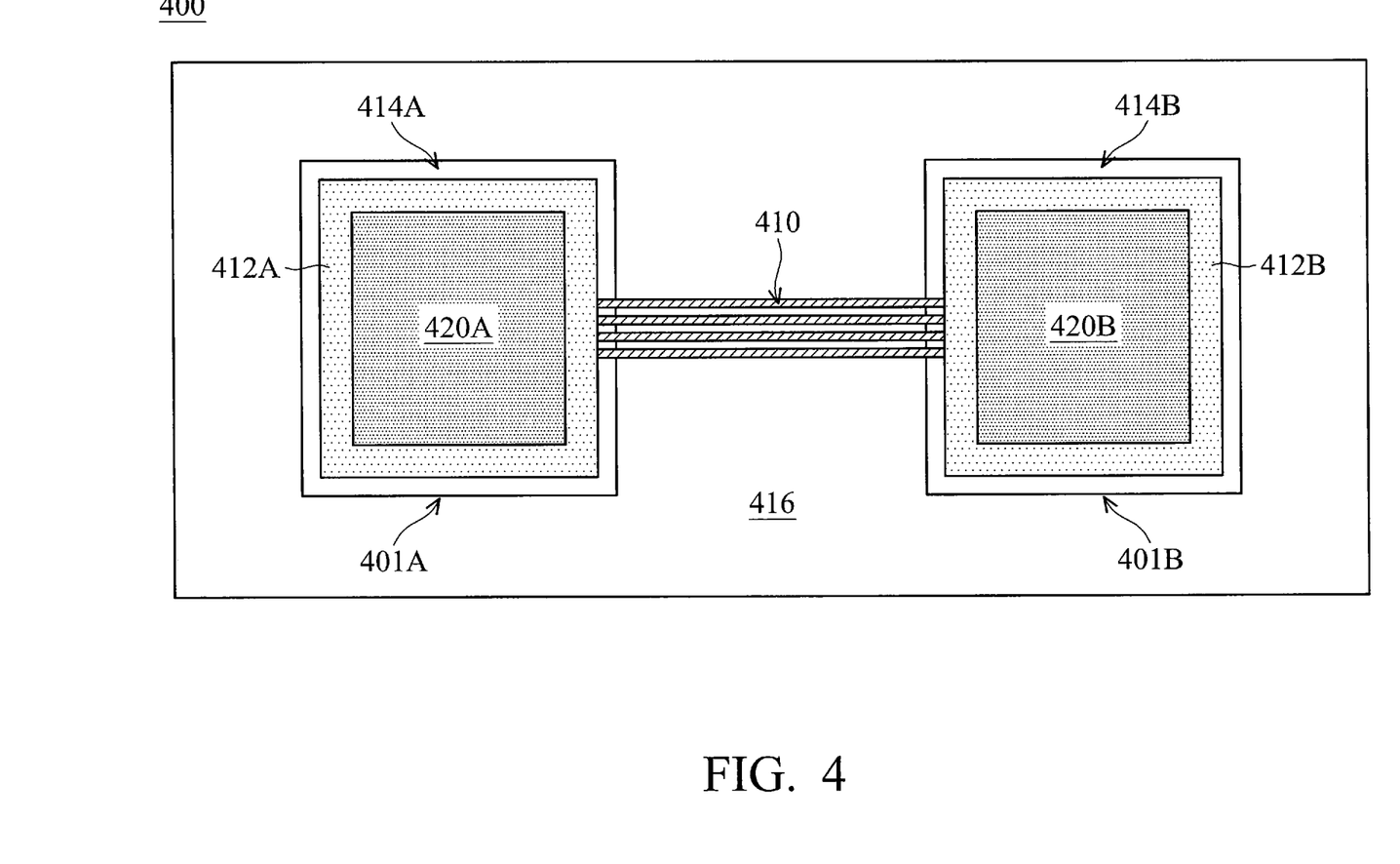
FIG. 4 illustrates a top view of an exemplary system including two exemplary optical interconnect devices, per FIG. 2 and FIG. 3, and coupled together via a waveguide array, in accordance with some embodiments of the present disclosure.

FIG. 4 illustrates a top view of an exemplary system 400 including two exemplary optical interconnect devices 401A and 401B, per FIG. 2 and FIG. 3, that are mounted on a common board 416 and coupled via a waveguide array 410, in accordance with some embodiments of the present disclosure. The optical interconnect device 401A can include a socket 414A disposed beneath a substrate 412A, which in turn can be disposed beneath a heat spreader 420A. Similarly, the optical interconnect device 401B can include a socket 414B disposed beneath a substrate 412B, which in turn can be disposed beneath a heat spreader 420B. The optical interconnect device 401A can be coupled to the optical interconnect device 401B via the waveguide array 410.

As shown in FIG. 4, in some embodiments, the waveguide array 410 includes multiple (e.g., 4) waveguides disposed parallel to one another to provide optical coupling between the optical interconnect devices 401A and 401B. In some embodiments, each of the waveguides of the waveguide array 410 can be made from polymer-based materials. In some embodiments, the structures and functionality of the optical interconnect devices 401A and 401E are similar to those described above with respect to FIGS. 2 and 3 and, therefore, not described again here.

Figure 5:
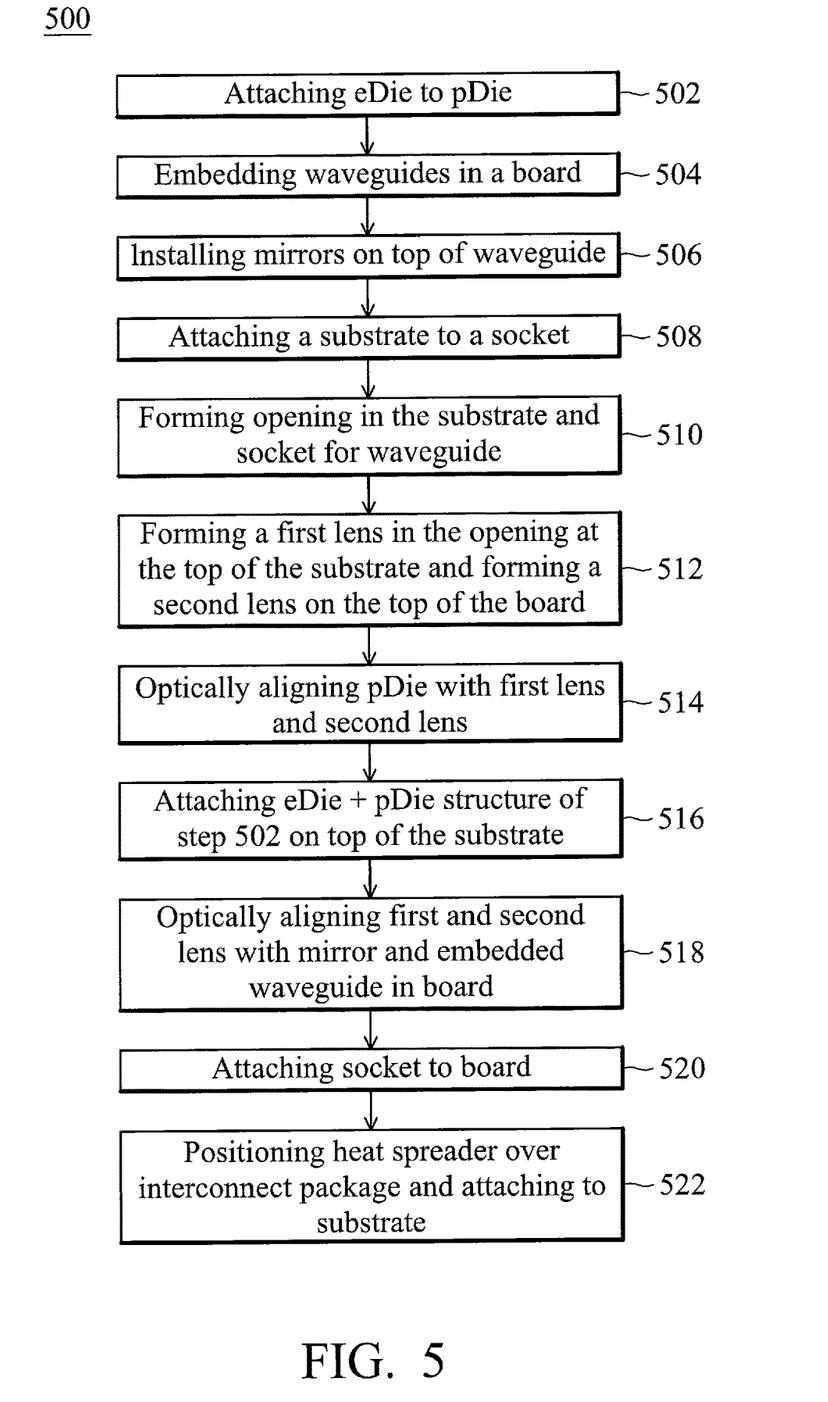
FIG. 5 illustrates a flow chart of an exemplary method for making an exemplary optical interconnect device per FIG. 2 and FIG. 3, in accordance with some embodiments of the present disclosure.

FIG. 5 illustrates a flow chart 500 of an exemplary method for making an exemplary optical interconnect devices 200 and 300 per FIG. 2 and FIG. 3, respectively, in accordance with some embodiments of the present disclosure. The exemplary method disclosed below recites the steps for making the exemplary optical interconnect device 200. Similar relationships apply to the exemplary optical interconnect device 300 including the plurality of micro-lenses 306, the mirror structure 308 and the waveguide array 310. At a first operation 502, the method includes attaching the first portion 203A of the eDie 202 on top of the pDie 204 via the hybrid bonds 218 to form a eDie 202/pDie 204 structure. Next, at operation 504, the method includes fabricating and embedding the waveguide 210 (and the waveguide array 310) on a top portion of the board 216 with one end of the waveguide 210 extending to an external end of the board 216. Next, at operation 506, the method includes installing the mirror 208 at an inner end of waveguide 210, opposite the external edge of board 216. Similarly, the method can include installing additional mirror structures 308 at the inner edge of each waveguide in the waveguide array 310. In alternative embodiments, a single mirror structure 208 extends laterally across the inner ends of waveguide in the waveguide array 310.

Next, at operation 508, the method includes attaching the substrate 212 on top of the socket 214 via the package bumps 224A. At operation 510, the method further includes forming opening(s) in the substrate 212 and the socket 214 to provide a light path for optical coupling between a pDie 204 and a respective waveguide. In some embodiments, corresponding openings for each waveguide in the waveguide array 310 are formed. Next, at operation 512, the method includes forming the first micro-lens 206 adjacent the opening at a top surface of the substrate 212 and forming the second micro-lens 207 on the top of the board 216, adjacent the opening at a bottom surface of the socket 214, and adjacent to mirror(s) 208, to provide an optical pathway and coupling to the waveguide 210. In some embodiments, the second micro-lens 207 is optically aligned with the mirror 208 at a 45 degree angle so as to reflect a light beam that travels through the second micro-lens 207 at a 90 degree angle toward an input of the waveguide 210. Similarly, the plurality of micro-lenses 306/307, the mirror structures 308 and the waveguide array 310 can be aligned with respect to one another to provide optical coupling between the one or more eDies 202 and an external system.

Next, at operation 514, the method includes optically aligning the pDie 204 with the first micro-lens 206 and the second micro-lens 207, which are positioned at respective openings formed in the substrate 212 and the socket 214. At operation 516, the method includes attaching the eDie 202/pDie 204 structure, as constructed in step 502, on top of substrate 212. In some embodiments, the second portion 203B of eDie 202 is attached via flip-chip interconnection method (e.g., C4 bumps 222). The pDie 204 is positioned on the substrate 212, aligned with the first micro-lens 206 that is positioned in the hole at the top of the substrate 212. At operation 518, the method further includes optically aligning the first micro-lens 206 and second micro-lens 207 with the mirror 208 and waveguide 210 that is embedded in the board 216. Next, at operation 520, the method includes attaching the socket 214 to the board 216 via the package bumps 224B. Then, at operation 522, the exemplary optical interconnect device 200 is completed by positioning the heat spreader 220 on top of the eDie 202 and attaching the heat spreader 220 to the substrate 212.

The order of the operations described above with respect to FIG. 5 can be changed according to various embodiments of the present disclosure.

Functionally, in accordance with various embodiments, the eDie 202 can instruct the pDie 204 to emit a light signal 226 to the first micro-lens 206, which is optically coupled to the second micro-lens 207, which in turn is optically coupled to the mirror 208, which in turn is optically coupled to the waveguide 210. Thus, the light signal 226 is transmitted from the pDie 204 to generate an output of the waveguide 210, which is coupled to an external system or device configured to receive the light signal 226.

Figure 6:
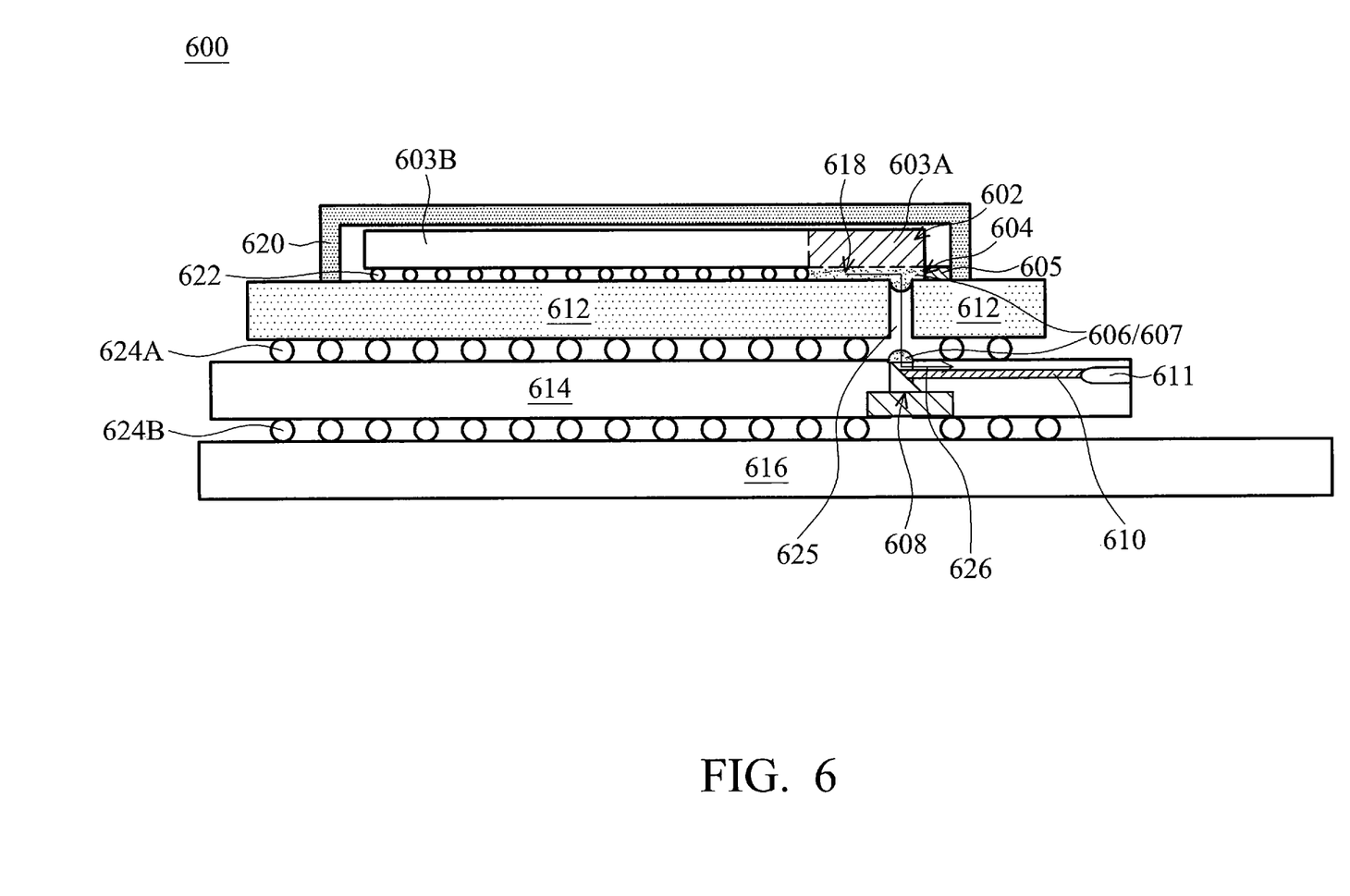
FIG. 6 illustrates a side view of an exemplary optical interconnect device including a photonics die (pDie) and an electronic die (eDie) integrated with a substrate, a socket, a board and a pair of micro-lenses that are coupled to a waveguide and a fiber connection embedded in the socket, in accordance with some embodiments of the present disclosure.

FIG. 6 illustrates a side view of an exemplary optical interconnect device 600 including an electronic die (eDie) 602 and a photonics die (pDie) 604 integrated with a substrate 612, socket 614, a board 616 and a pair of micro-lenses (first micro-lens 606 and second micro-lens 607), a mirror 608 that is coupled to a waveguide 610, a fiber connector 611 and a heat spreader 620, in accordance with some embodiments of the present disclosure.

In some embodiments, a first portion 603A of eDie 602 can be disposed on top of the pDie 604 and coupled via hybrid bonds 618 and a second portion 603B of the eDie 602 can be disposed on top of the substrate 612 and coupled via a flip-chip interconnection method (C4 bump 622). The hybrid bonds 618 can be micro-bumps (µbumps) or hybrid bumps, in accordance with some embodiments. The pDie 604 can be positioned between the first portion 603A of eDie 602 and the substrate 612. The eDie 202 can comprise an ASIC switch, for example.

In some embodiments, the pDie 604 can be a silicon-on-insulator (SOI) chip that is hybrid integrated face-to-face with the integrated switch of eDie 602 in a diving-board configuration, in which a portion 605 of the pDie 604 extends beyond an edge of the eDie 602. In this position, the pDie 604 is still disposed above the substrate 612. The diving-board configuration can provide easy access and physical space for attachments to one or more other components, in accordance with some embodiments. For example, optical couplers (e.g., lenses) for optical fibers and light sources can be attached to the exposed surface of the pDie 604. For example, one option is laser-on-chip, where the lasing material is directly bonded and coupled to the photonics die. Another option is to use a fiber connector on board/socket to connect to an external light source.

Socket 614 can be disposed beneath substrate 612 and coupled to substrate 612 via package bumps 624A. Similarly, the board 616 can be disposed beneath socket 614 and coupled to board 616 via package bumps 624B. In some embodiments, substrate 612 is an interposer and socket 614 is considered a second substrate. The heat spreader 620 can be positioned above the eDie 202 and attached to the substrate 612. The heat spreader 620 transfers energy, i.e., heat, from a hotter source, eDIE 602, to a colder heat sink, e.g., the substrate 612.

In some embodiments, eDie 602 sends an electrical signal to the pDie 604, causing the pDie 604 to transmit a light signal 626 to the first micro-lens 606. As illustrated, the first micro-lens 606 can be formed beneath the pDie 604 and on top of the substrate 612 and second micro-lens 607 can be formed on top of socket 614. The first micro-lens 606 and second micro-lens 607 are optically coupled via a hole etched or drilled in substrate 612, which forms a light path 625 through which a light signal 226 can propagate. The hole is aligned to provide the light path 625 through the substrate, which allows a direct line of sight between first micro-lens 606 and second micro-lens 607. Thus, the first micro-lens 606 is optically coupled to the second micro-lens 607 to allow transmission of the light signal 626 there between. The first micro-lens 606 and second micro-lens 607 can be fabricated with silicon on insulator (SOI), silicon or polymer, in accordance with various embodiments. Thus, polymer lenses can be integrated with the package with waveguides embedded in the socket 614.

In some embodiments, the first micro-lens 606 and second micro-lens 607 are lens arrays that function similar to the package bumps 624A. In some embodiments, a diameter of the first micro-lens 606 and second micro-lens 607 can be in the range of 80 to 150 µm (e.g., 100 µm). The hole extending through the substrate 612 can be filled with air or organic materials that are transparent for a selected wavelength of the light signal 626 generated by the pDie 604, in accordance with various embodiments.

In some embodiments, the mirror 608 can be positioned on the top of the socket 614 by first forming the hole in the substrate 612, then placing and gluing the mirror 608 to the socket 614. The mirror 608 can be positioned at a 45 degree angle relative to the light signal 626 received from the second micro-lens 607. The light signal 626 is then reflected by mirror 608 and coupled to waveguide 610. The waveguide 610 is coupled to the fiber connector 611. As illustrated, the waveguide 610 and the fiber connector 611 are embedded within a top portion of the socket 614 and suitability positioned to be optically coupled with the mirror 608. In some other embodiments, the mirror 608 can be positioned at an angle other than 45 degrees angle relative to the light signal 626 based on an alternative structure of the socket 614.

As illustrated in FIG. 6 compared to FIG. 2, the waveguide 610 is embedded in the socket 614 rather than the board 616. This structure can improve performance since the light source is closer to the waveguide 610, i.e., the optical components have improved proximity to one another. Also, improved integration can be achieved since the socket area is used for the waveguide 610 and the fiber connector 611, so the board area is available for other components. In some embodiments, mirror 608 is fabricated with metal-coated silicon.

Figure 7:
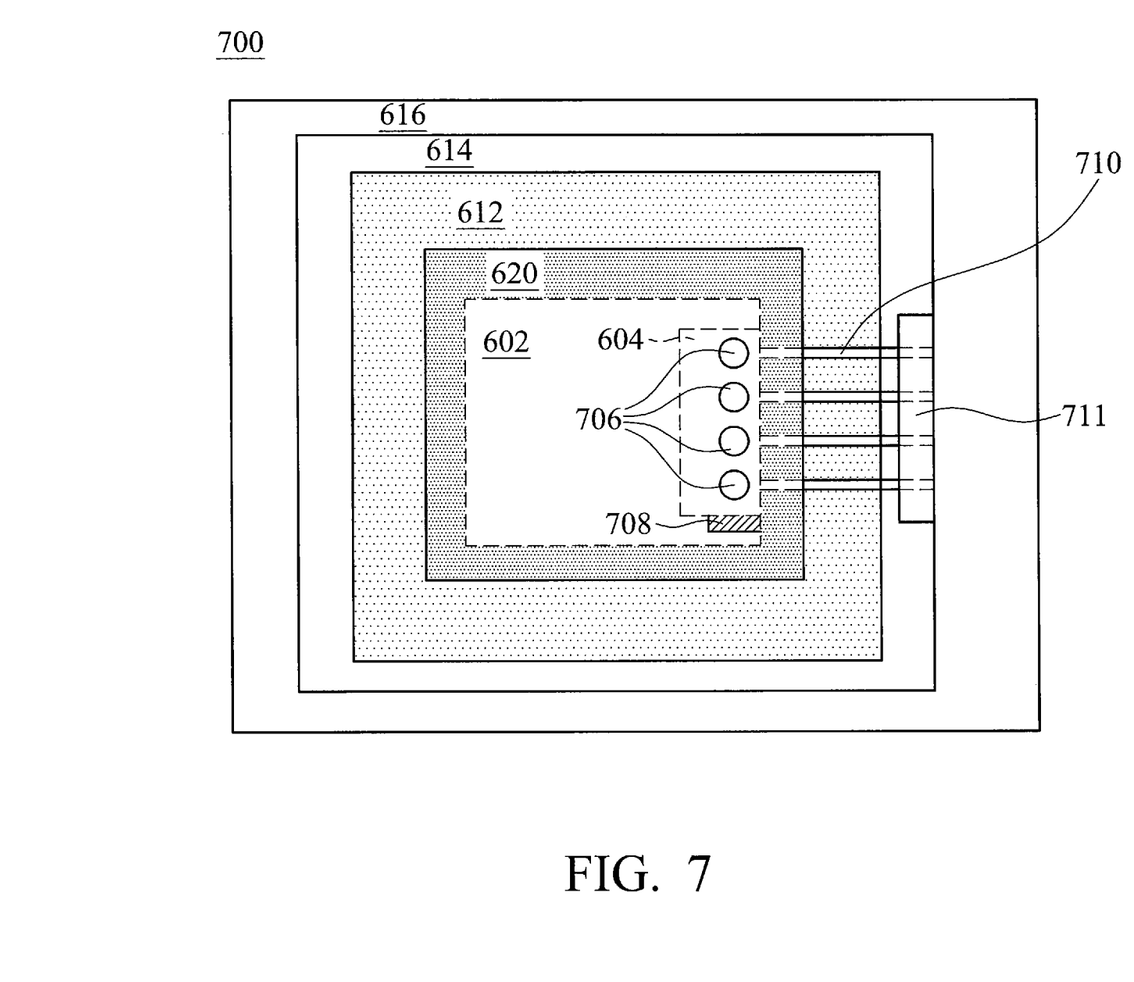
FIG. 7 illustrates a top view of an exemplary optical interconnect device per FIG. 6, in accordance with some embodiments of the present disclosure.

FIG. 7 illustrates a top view of an exemplary optical interconnect device 700 corresponding to exemplary optical interconnect device 600 of FIG. 6, in accordance with some embodiments of the present disclosure. As illustrated, a board 616 is disposed underneath a socket 614, which in turn is disposed underneath a substrate 612, which in turn is disposed underneath a heat spreader 620. Disposed between the socket 614 and the heat spreader 620 are an eDie 602, a pDie 604, a plurality of micro-lenses 706 and a mirror structure 708. As shown in FIG. 7, the larger dotted line box indicates the positioning of the eDie 602 disposed beneath the heat spreader 620. The smaller dotted line box indicates positioning of the pDie 604 and the plurality of micro-lenses 706 disposed beneath the eDie 602. As illustrated, since the mirror structure 708 is disposed on top of the socket 614, the mirror structure 708 can be referred to an on-socket mirror. Projecting from the socket 614 is the waveguide array 710, which is coupled to a fiber connector 711. The number of lenses in the plurality of the micro-lenses 706 is the same as the number of waveguides 710 of the waveguide array 710 and the number of fiber connectors 711 that connect respective fibers of a fiber array, as discussed in further detail below. As illustrated, the number of microlenses 706, waveguides 710 and fiber connectors 711 is four, in accordance with some embodiments. In some other embodiments, this number can be different. In some embodiments, the heat spreader 220 is attached to the substrate 612. In some embodiments, the mirror 608 is fabricated with a metal-coated silicon.

Figure 8:
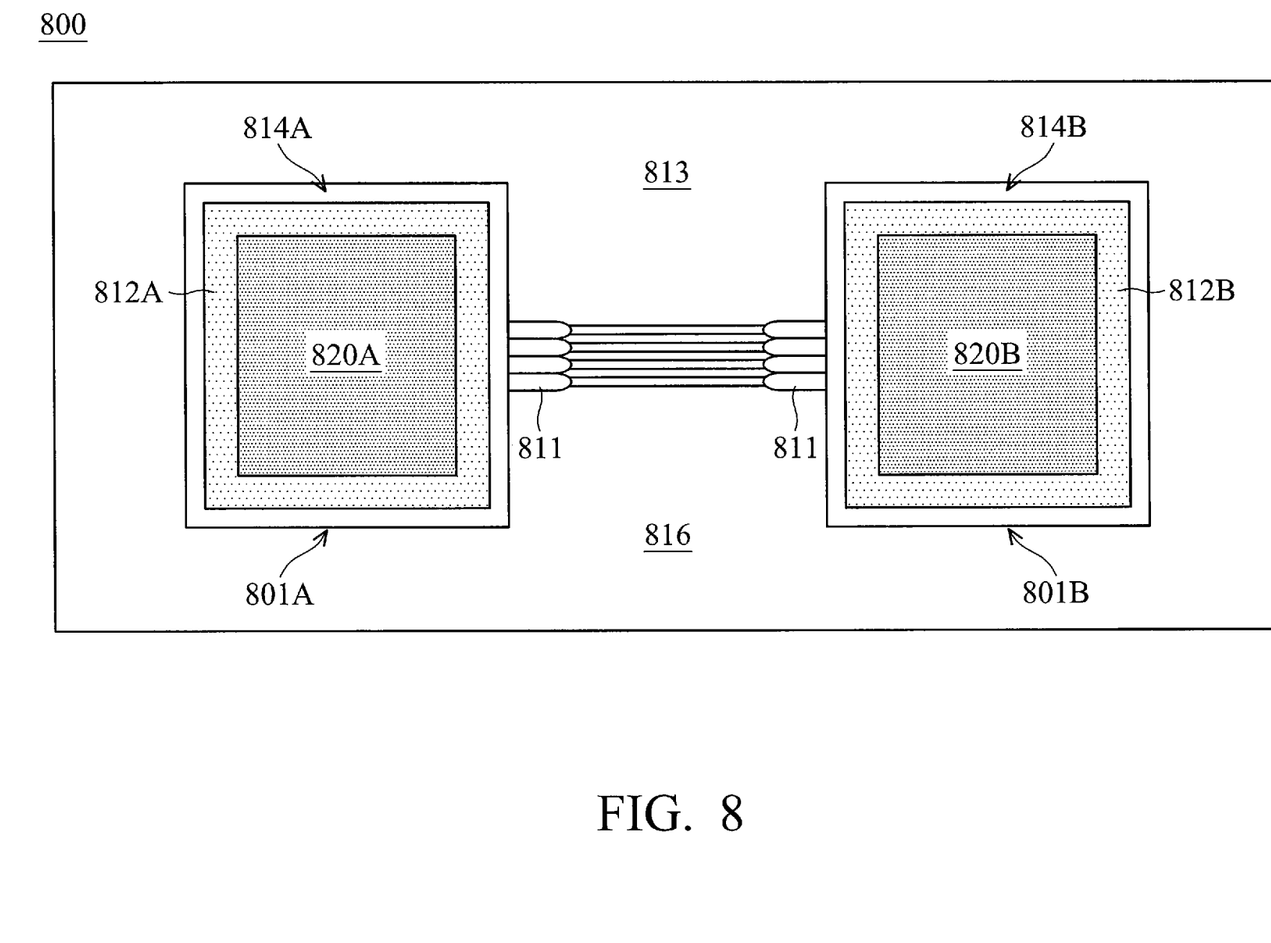
FIG. 8 illustrates a top view of an exemplary system including two exemplary optical interconnect devices per FIG. 6 and FIG. 7, in accordance with some embodiments of the present disclosure.

FIG. 8 illustrates a top view of an exemplary system 800 including two exemplary optical interconnect devices 801A and 801B, per FIG. 6 and FIG. 7, mounted on a common board 816 and coupled via a fiber array 813, in accordance with some embodiments of the present disclosure. The optical interconnect device 801A can include a socket 814A disposed beneath a substrate 812A, which is disposed beneath a heat spreader 820A. Similarly, the optical interconnect device 801B can include a socket 814B disposed beneath a substrate 812B, which is disposed beneath a heat spreader 820B. The optical interconnect device 801A can be coupled to optical interconnect device 801B via the fiber array 813. The interfaces between the fiber array 813 and the optical interconnect devices 801A and 801B are fiber connectors 811. As shown in FIG. 8, in some embodiments, the fiber array 813 includes multiple (e.g., 4) fibers disposed parallel to one another to provide optical coupling between the optical interconnect devices 801A and 801B via fiber connectors 811 formed on or embedded within a socket or board. In some embodiments, the structures and functionality of the optical interconnect devices 801A and 801B are similar to those described above with respect to FIGS. 6 and 7 and, therefore, not described again here.

Figure 9:
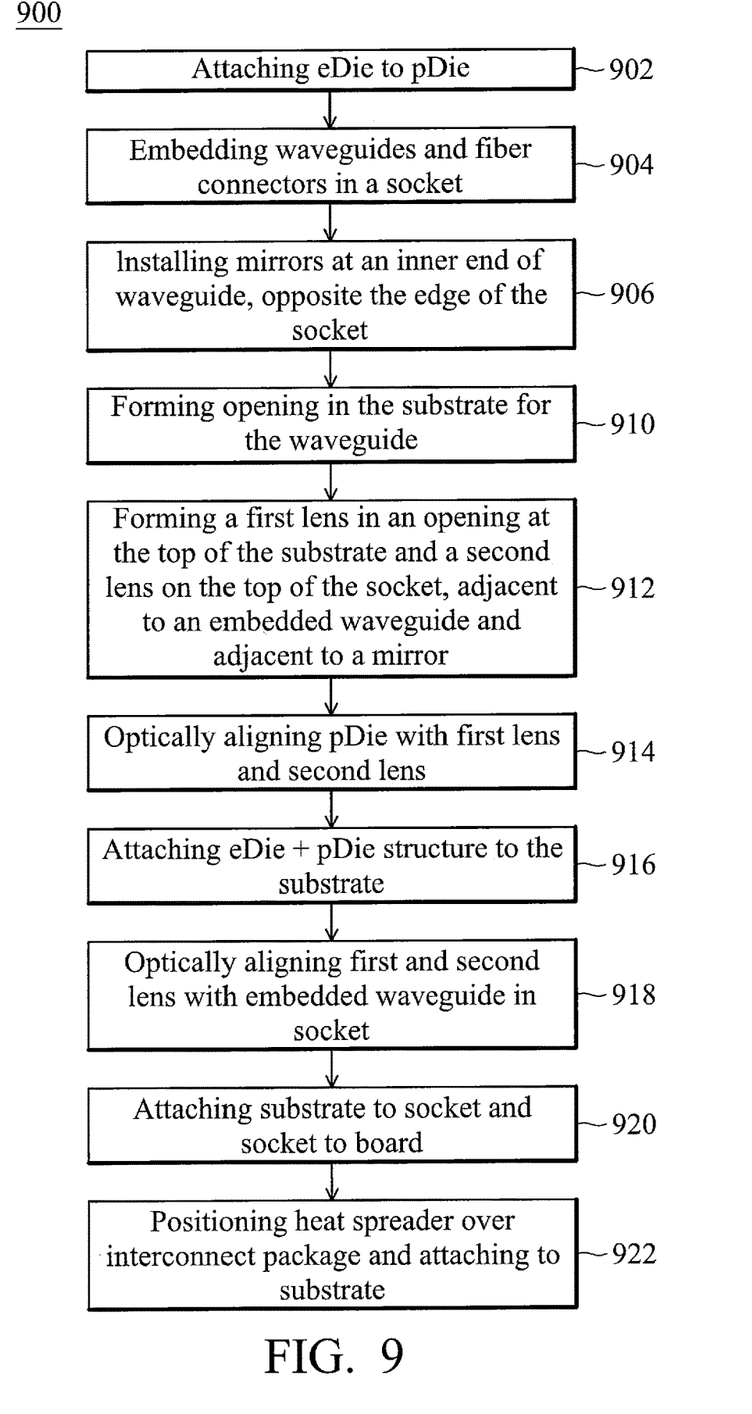
FIG. 9 illustrates a flow chart of an exemplary method for making an exemplary optical interconnect device per FIG. 6 and FIG. 7, in accordance with some embodiments of the present disclosure.

FIG. 9 illustrates a flow chart 900 of an exemplary method for making an exemplary optical interconnect devices 600 and 700 per FIG. 6 and FIG. 7, respectively, in accordance with some embodiments of the present disclosure. The exemplary method disclosed below recites the steps for the exemplary optical interconnect device 600. Similar relationships apply to the exemplary optical interconnect device 700 including the plurality of micro-lenses 706, the mirror structure 708, the waveguide array 710 and the fiber connector 711. The exemplary method comprises the following steps: At the first operation 902, the method includes attaching the first portion 603A of the eDie 602 on top of the pDie 604 via the hybrid bonds 618 to form an eDie 202/pDie 204 structure. Next, at operation 904, the method includes fabricating and embedding the waveguide 610 and the fiber connector 611 in the socket 614. The waveguide 610 and the fiber connector 611 can be fabricated on a top portion of the socket 614. The fiber connector 611 can be coupled to one end of waveguide 610 and the fiber connector 611 extends to an external end of the socket 614, as illustrated in FIG. 6.

At operation 906, the method includes installing the mirror 608 at an inner end of waveguide 610, opposite an outer end coupled to the fiber connector 611. Similarly, the method can include installing additional mirror structures 808 at the inner edge of each waveguide in waveguide array 710. In an alternative embodiment, a single mirror structure 708 extends laterally across the inner ends of each waveguide in the waveguide array 710. Next, at operation 910, the method includes forming an opening in substrate 612 to support optical connections for the waveguide 610. The opening provides a light path 625 for optical coupling between a pDie 614 and a respective waveguide. Similarly, the method can include forming openings for each waveguide in the waveguide array 310. Next, at operation 912, the method includes forming the first micro-lens 606 adjacent the opening at a top surface of the substrate 612 and forming the second micro-lens 607 on the top of the socket 614, adjacent the opening at the bottom surface of the substrate 212, and adjacent to mirror(s) 208, to provide an optical pathway and coupling to the waveguide 610.

In some embodiments, the second micro-lens 607 is optically aligned with the mirror 608 with a 45 degree angle so as to reflect a light beam that travels through the second micro-lens 607 at a 90 degree angle towards an input of the waveguide 610. Similarly, the plurality of micro-lenses 706, mirror structure 708 and waveguide array 710 can be aligned with respect to one another to provide optical coupling between the one or more eDies 602 and an external system. Next, at operation 914, the method includes optically aligning the pDie 604 with the first micro-lens 606 and second micro-lens 607, which are positioned at respective openings formed in the substrate 612, At operation 916, the method includes attaching the eDie 602/pDie 604 structure, as constructed in step 902, to substrate 612. In some embodiments, the second portion 603B of eDie 602 is attached via flip-chip interconnection method (e.g., C4 bump 622). The pDie 604 is positioned on the substrate 612, aligned with the first micro-lens 606 that is positioned in the hole at the top of substrate 612. Next, at operation 918, the method includes optically aligning the first micro-lens 606 and second micro-lens 607 with the mirror 608 and the waveguide 610 that is embedded in the socket 614. Next, at operation 920, the method includes attaching the substrate 612 to the socket 614 and the socket 614 to the board 616 via the package bumps 624A and 624B, respectively. Then at operation 922, the exemplary optical interconnect device 600 is completed by positioning the heat spreader 620 on top of the eDie 602 and attaching the heat spreader 620 to the substrate 612.

The order of the operations described above with respect to FIG. 9 can be changed according to various embodiments of the present disclosure.

Functionally, in some embodiments, the eDie 602 can provide control signals to the pDie 604 that instruct the pDie 604 to emit the light signal 626 to the first micro-lens 606, which in turn is optically coupled to the second micro-lens 607, which in turn is optically coupled to the mirror 608, which in turn is optically coupled to the waveguide 610, which in turn is optically coupled to a fiber connector 611. Thus, light signal 626 is transmitted from the pDie 604 to the fiber connector 611. In this way, light signals can be transmitted between optical interconnect devices 814A and 814B, for example, coupled by a fiber array 813 and fiber connectors 811, for example, as shown in FIG. 8.

In one embodiment, an apparatus for an optical interconnect device is disclosed. The apparatus includes: a substrate; an electronic die; a photonics die, wherein a first portion of the electronic die is disposed on top of the photonics die and a second portion of the electronic die disposed on top of the substrate, wherein the photonics die is positioned between the first portion of the electronic die and the substrate and is configured to generate a light signal; a socket disposed beneath the substrate; a board disposed beneath the socket; at least one waveguide formed in the socket or board; at least one first micro-lens formed beneath the photonics die; at least one second micro-lens formed on top of the board, wherein the at least one first micro-lens and the at least one second micro-lens are optically coupled via at least one hole formed in the substrate and the socket; and at least one mirror installed on top of the board and optically aligned to the at least one second micro-lens and optically aligned to the at least one waveguide, wherein the at least one first micro-lens is optically coupled to the at least one second micro-lens, which in turn is optically coupled to the at least one mirror, which in turn is optically coupled to the at least one waveguide, respectively.

In another embodiment, an apparatus includes: a first optical interconnect structure; a second optical interconnect structure; and a fiber array that optically couples the first optical interconnect structure to the second optical interconnect structure, wherein each of the first and second optical interconnect structures, includes: a substrate; an electronic die; a photonics die, wherein a first portion of the electronic die is disposed on top of the photonics die and a second portion of the electronic die disposed on top of the substrate, wherein the photonics die is positioned between the first portion of the electronic die and the substrate; a socket disposed beneath the substrate; a board disposed beneath the socket; at least one waveguide formed in the socket or the board; at least one first micro-lens formed beneath the photonics die; at least one second micro-lens formed on top of the socket, wherein the at least one first micro-lens and the at least one second micro-lens is optically coupled via at least one hole formed in the substrate; and at least one mirror installed on the top of the socket and optically aligned to the at least one second micro-lens and optically aligned to the at least one waveguide.

In yet another embodiment, a method for implementing an optical interconnection can include the following operations: attaching an electronic die to a photonic die; embedding at least one waveguide in a socket or a printed circuit board (PCB); installing a mirror adjacent an inner end of the waveguide; attaching a substrate to the socket; forming an opening through at least the substrate; forming a first lens adjacent a first end of the opening; forming a second lens adjacent a second end of the opening opposite the first end; optically aligning the photonic die with the first lens and the second lens; attaching the attached electronic die and photonic die on top of the substrate; optically aligning the first lens and the second lens with the mirror and the embedded waveguide; and attaching the socket to the PCB.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a substrate;
   an electronic die;
   a photonics die, wherein a first portion of the electronic die is disposed on top of the photonics die and a second portion of the electronic die disposed on top of the substrate, wherein the photonics die is positioned between the first portion of the electronic die and the substrate and is configured to generate a light signal;
   a socket disposed beneath the substrate;
   a board disposed beneath the socket;
   at least one waveguide formed in the board;
   at least one first micro-lens formed beneath the photonics die and extending from a bottom surface of the photonics die into a first hole formed in the substrate;
   at least one second micro-lens formed on a top surface of the board and disposed below a bottom surface of the socket, wherein the at least one first micro-lens and the at least one second micro-lens are optically coupled via the first hole formed in the substrate and a second hole formed in the socket, wherein the first hole and the second hole are vertically aligned; and
   at least one mirror formed below the top surface of the board and optically aligned to the at least one second micro-lens and optically aligned to the at least one waveguide,
   wherein the at least one first micro-lens is optically coupled to the at least one second micro-lens, which in turn is optically coupled to the at least one mirror, which in turn is optically coupled to the at least one waveguide, respectively.

2. The apparatus of claim 1, further comprising:
   a heat spreader disposed on top of the first portion of the electronic die and the second portion of the electronic die, and attached to the substrate.

3. The apparatus of claim 1, wherein the at least one first micro-lens is fabricated on a substrate of silicon on insulator (SOI) or silicon (Si).

4. The apparatus of claim 1, wherein the first hole and the second hole are filled with at least one organic material that is transparent for a selected wavelength of the light signal generated by the photonics die.

5. The apparatus of claim 1, wherein the at least one mirror is installed below the top surface of the board by forming a hole in the board, then placing and gluing the at least one mirror to the board within the hole.

6. The apparatus of claim 1, wherein the at least one mirror is positioned at a 45 degree angle relative to the light signal received from the at least one second micro-lens and the at least one embedded waveguide.

7. The apparatus of claim 1, wherein the at least one mirror is fabricated with metal-coated silicon.

8. The apparatus of claim 1, wherein the photonics die is configured to generate the light signal based on an input from the electronic die, wherein the light signal is transmitted through the at least one first micro-lens and the at least one second micro-lens, and then reflected via the at least one mirror to the at least one waveguide.

9. The apparatus of claim 1, further comprising at least one fiber connector coupled to the at least one embedded waveguide.

10. The apparatus of claim 1, wherein the at least one waveguide comprises a plurality of waveguides to form a waveguide array.

11. An apparatus comprising:
a first optical interconnect structure;
a second optical interconnect structure; and
a fiber array that optically couples the first optical interconnect structure to the second optical interconnect structure,
wherein each of the first and second optical interconnect structures, comprises:
a substrate;
an electronic die;
a photonics die, wherein a first portion of the electronic die is disposed on top of the photonics die and a second portion of the electronic die disposed on top of the substrate, wherein the photonics die is positioned between the first portion of the electronic die and the substrate;
a socket disposed beneath the substrate;
a board disposed beneath the socket;
at least one waveguide formed in the board;
at least one first micro-lens formed beneath the photonics die and extending from a bottom surface of the photonics die into a first hole formed in the substrate;
at least one second micro-lens formed on a top surface of the board and disposed below a bottom surface of the socket, wherein the at least one first micro-lens and the at least one second micro-lens is optically coupled via the first hole formed in the substrate and a second hole formed in the socket, wherein the first hole and the second hole are vertically aligned; and
at least one mirror installed formed below the top surface of the board and optically aligned to the at least one second micro-lens and optically aligned to the at least one waveguide.

12. The apparatus of claim 11, wherein each of the first and second optical interconnect structures further comprises at least one fiber connector coupled to the at least one waveguide, and wherein the at least on fiber is coupled to at least one fiber of the fiber array.

13. The apparatus of claim 11, wherein the at least one mirror is installed below the top surface of the board by forming a hole in the board, then placing and gluing the at least one mirror to the board within the hole.

14. The apparatus of claim 11, wherein the at least one first micro-lens and the at least one second micro-lens are polymer lenses.

15. The apparatus of claim 11, wherein the photonics die is configured to generate a light signal based on an input from the electronic die, wherein the light signal is coupled through the at least one first micro-lens and the at least one second micro-lens, and then the light signal is reflected via the at least one mirror to one of the at least one waveguide, and wherein the light signal is coupled through the at least one first micro-lens via a laser-on-chip, where lasing material is directly bonded and coupled to the photonics die.

16. An apparatus comprising:
a substrate;
an electronic die;
a photonics die disposed below the electronic die;
a heat spreader above the electronic die and attached to the substrate;
a socket disposed beneath the substrate;
a board disposed beneath the socket;
at least one waveguide formed in the board;
at least one first micro-lens formed beneath the photonics die and extending from a bottom surface of the photonics die into a first hole formed in the substrate;
at least one second micro-lens formed on a top surface of the board and disposed below a bottom surface of the socket, wherein the at least one first micro-lens and the at least one second micro-lens are optically coupled via the first hole formed in the substrate and a second hole formed in the socket, wherein the first hole and the second hole are vertically aligned; and
at least one mirror formed below the top surface of the board and optically aligned to the at least one second micro-lens and optically aligned to the at least one waveguide,
wherein the at least one first micro-lens is optically coupled to the at least one second micro-lens, which in turn is optically coupled to the at least one mirror, which in turn is optically coupled to the at least one waveguide, respectively.

17. The apparatus of claim 16, wherein the first hole and the second hole are filled with an organic material that is transparent for a selected wavelength of the light signal generated by the photonics die.

18. The apparatus of claim 16, wherein the at least one mirror is installed below the top surface of the board by forming a hole in the board, then placing and gluing the at least one mirror to the board within the hole.

19. The apparatus of claim 16, wherein the at least one mirror is positioned at a 45 degree angle relative to the light signal received from the at least one second micro-lens and the at least one embedded waveguide.

20. The apparatus of claim 16, further comprising at least one fiber connector coupled to the at least one embedded waveguide.

* * * * *